United States Patent
You et al.

(10) Patent No.: US 10,304,734 B2
(45) Date of Patent: May 28, 2019

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Woo Kyung You, Incheon (KR); Jong Min Baek, Seoul (KR); Sang Shin Jang, Gwangyang-si (KR); Byung Hee Kim, Seoul (KR); Vietha Nguyen, Yongin-si (KR); Nae In Lee, Seoul (KR); Woo Jin Lee, Gyeongi-do (KR); Eun Ji Jung, Hwaseong-si (KR); Kyu Hee Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/046,081

(22) Filed: Jul. 26, 2018

(65) Prior Publication Data
US 2018/0330987 A1  Nov. 15, 2018

Related U.S. Application Data

(62) Division of application No. 15/393,506, filed on Dec. 29, 2016, now Pat. No. 10,062,609.

(30) Foreign Application Priority Data

Jul. 27, 2016  (KR) .......................... 10-2016-0095736

(51) Int. Cl.
*H01L 21/00* (2006.01)
*H01L 21/768* (2006.01)
*H01L 23/528* (2006.01)

(52) U.S. Cl.
CPC .... *H01L 21/76883* (2013.01); *H01L 21/7682* (2013.01); *H01L 21/76802* (2013.01); *H01L 21/76829* (2013.01); *H01L 23/528* (2013.01)

(58) Field of Classification Search
CPC ............. H01L 21/76883; H01L 23/528; H01L 21/76802
See application file for complete search history.

(56) References Cited

U.S. PATENT DOCUMENTS

| | | | | |
|---|---|---|---|---|
| 6,287,979 | B1 * | 9/2001 | Zhou ...................... | B82Y 10/00 438/723 |
| 6,399,476 | B2 * | 6/2002 | Kim ..................... | H01L 21/7682 257/E21.581 |
| 6,815,329 | B2 * | 11/2004 | Babich ................ | H01L 21/7681 257/E21.579 |
| 6,949,456 | B2 * | 9/2005 | Kumar .............. | H01L 21/76807 257/522 |

(Continued)

*Primary Examiner* — Laura M Menz
(74) *Attorney, Agent, or Firm* — Myers Bigel, P.A.

(57) ABSTRACT

A semiconductor device includes a first insulating interlayer on a substrate, metal lines in the first insulating interlayer, a first air gap between the metal lines in a first region of the substrate and a second air gap between the first insulating interlayer and at least one of the metal lines in a second region of the substrate, a liner layer covering top surfaces and side walls of the metal lines and a top surface and a side wall of the first insulating interlayer, adjacent to the first and second air gaps, and a second insulating interlayer on the liner layer and contacting the liner layer.

20 Claims, 9 Drawing Sheets

(56) References Cited

U.S. PATENT DOCUMENTS

| | | | |
|---|---|---|---|
| 7,094,689 B2* | 8/2006 | Su | H01L 21/7682 257/E21.581 |
| 7,671,442 B2* | 3/2010 | Anderson | H01L 21/76802 257/276 |
| 7,790,601 B1 | 9/2010 | Choi et al. | |
| 8,129,264 B2* | 3/2012 | Kim | C23C 16/402 257/E21.495 |
| 8,357,605 B2* | 1/2013 | Lee | H01L 21/28273 257/E21.179 |
| 8,962,474 B2 | 2/2015 | Yu et al. | |
| 9,245,849 B2 | 1/2016 | Park et al. | |
| 9,305,835 B2 | 4/2016 | Alptekin et al. | |
| 9,524,937 B2* | 12/2016 | Baek | H01L 23/53223 |
| 9,842,803 B2* | 12/2017 | Baek | H01L 23/53223 |
| 2006/0030128 A1 | 2/2006 | Bu et al. | |
| 2006/0073695 A1 | 4/2006 | Filippi et al. | |
| 2009/0298282 A1* | 12/2009 | Yun | H01L 21/7682 438/653 |
| 2013/0256761 A1* | 10/2013 | Sim | H01L 27/0207 257/208 |
| 2015/0187699 A1* | 7/2015 | Baek | H01L 23/53223 257/773 |
| 2017/0092578 A1* | 3/2017 | Baek | H01L 23/53223 |

\* cited by examiner

SEMICONDUCTOR DEVICES AND METHODS OF MANUFACTURING THE SAME

CROSS-REFERENCE TO RELATED APPLICATION

The present application claims priority under 35 U.S.C. § 120 as a divisional of U.S. patent application Ser. No. 15/393,506, filed Dec. 29, 2016, which in turn claims priority under 35 U.S.C. § 119 to Korean Patent Application No. 10-2016-0095736, filed on Jul. 27, 2016, in the Korean Intellectual Property Office, the disclosures of which are hereby incorporated by reference in their entirety.

BACKGROUND

Technical Field

Embodiments of the present disclosure relate to semiconductor devices and methods of manufacturing the same.

Discussion of Related Art

As the need for high performance, high speed and/or multifunction semiconductor devices has increased, semiconductor devices have become more highly integrated. With this high integration, the widths of the wiring lines thereof and the spacings therebetween have become reduced. As the spacing between adjacent wiring lines is reduced, a parasitic capacitance can be generated between the wiring lines.

SUMMARY

Example embodiments of the present inventive concepts may provide a semiconductor device with an improved electrical characteristic and a method of manufacturing the same.

According to an example embodiment of the inventive concepts, a semiconductor device may include a first insulating interlayer on top of a substrate, metal lines in the first insulating interlayer, the metal lines including a plurality of first metal lines in a first region of the first insulating interlayer and a plurality of second metal lines in a second region of the first insulating interlayer, a first void between first and second ones of the metal lines and a second void between the first insulating interlayer and a first one of the second metal lines, a liner layer covering top surfaces and side walls of the metal lines and a top surface and a side wall of a portion of the first insulating interlayer that is adjacent the second void, and a second insulating interlayer that directly contacts the liner layer.

According to an example embodiment of the inventive concepts, a semiconductor device may include a first insulating interlayer on a substrate, first metal lines arranged at a first interval in the first insulating interlayer and second metal lines arranged at a second interval that is larger than the first interval in the first insulating interlayer, and air gaps on at least one side of each of the first metal lines and on at least one side of a first one of the second metal lines. Some of the air gaps are disposed between respective pairs of adjacent ones of the first metal lines, and the first insulating interlayer is not disposed between the pairs of adjacent ones of the first metal lines, and at least one of the air gaps and the first insulating interlayer are disposed between a pair of adjacent ones of the second metal lines.

According to an example embodiment of the inventive concepts, a method of manufacturing a semiconductor device may include sequentially forming a first insulating interlayer and an etch stop layer on a substrate, forming a second insulating interlayer including a groove on the etch stop layer, forming sacrificial layer in the groove, forming a metal mask layer on the second insulating interlayer and the sacrificial layer, forming a hard mask layer on the metal mask layer, forming a first recess pattern and a second recess pattern in the hard mask layer, forming a hole pattern penetrating the hard mask layer and the metal mask layer under the second recess pattern, etching the first insulating interlayer, the second insulating interlayer and a portion of the sacrificial layer using the hard mask layer including the first and second recess patterns and the hole pattern and the metal mask layer including the hole pattern as an etch mask to form a first trench and a second trench that expose the etch stop layer and a via hole penetrating the etch stop layer and the first insulating interlayer, under the second trench, forming a first metal line in the first trench, a second metal line in the second trench and a conductive via in the via hole, etching remaining portions of the sacrificial layer to form air gap trenches exposing at least one sidewall of the first metal line, at least one sidewall of the second metal line and a top surface of the etch stop layer, forming a liner layer covering inner surfaces of the air gap trenches, and forming a third insulating interlayer on the liner layer to seal the air gap trenches.

Pursuant to further embodiments, methods of manufacturing a semiconductor device may be provided in which a first insulating interlayer is formed on a substrate. The first insulating interlayer may be then patterned. A sacrificial pattern may be formed within openings in the patterned first insulating interlayer. The sacrificial pattern and the patterned first insulating interlayer may be then patterned to form a plurality of openings in the sacrificial pattern and the patterned first insulating interlayer. A plurality of metal lines may be formed in the openings. At least some of a remaining portion of the sacrificial pattern may be removed to form air gaps between at least some of the metal lines. A liner layer may be conformally formed on top surfaces of the metal lines, top surfaces of the patterned first insulating interlayer and exposed side surfaces of the metal lines and of the patterned first insulating interlayer.

DETAILED DESCRIPTION

Figure 1:
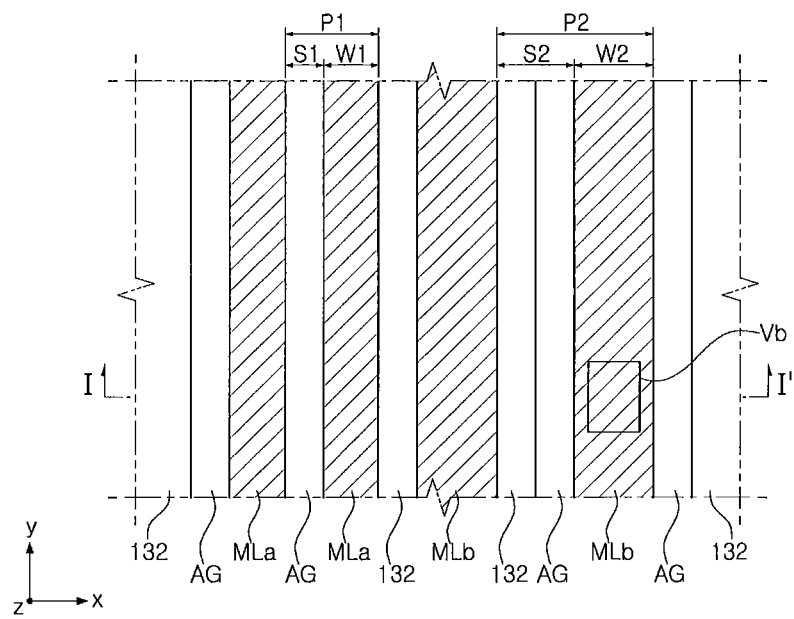
FIG. 1 is a lay-out diagram that schematically illustrates semiconductor devices according to example embodiments.
Figure 2:
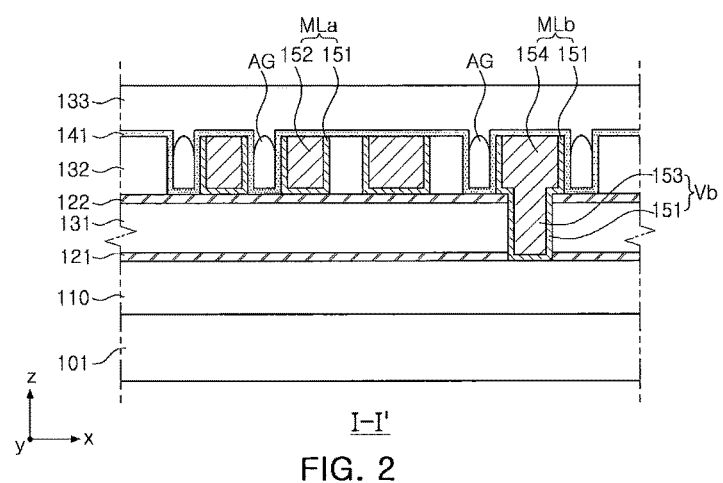
FIGS. 2 to 5 are cross-sectional views taken along line I-I' of FIG. 1 illustrating semiconductor devices according to example embodiments.

The inventive concepts will now be described more fully hereinafter with reference to the accompanying drawings, in which example embodiments of the inventive concepts are shown. The inventive concepts may, however, be embodied in different forms and should not be construed as limited to the embodiments set forth herein FIG. 1 is a lay-out diagram that schematically illustrates semiconductor devices according to example embodiments. FIG. 2 is a cross-sectional view taken along line I-I' of FIG. 1 illustrating a semiconductor device according to an example embodiments. In FIG. 1, a third insulating interlayer 133 and a liner layer 141 that are shown in FIG. 2 and included in the semiconductor device are omitted from the drawing to better illustrate other elements of the semiconductor device. Additionally, vertical portions of the liner layer 141 that are illustrated in FIG. 2 are shown as being part of the air gaps AG in FIG. 1. It will be appreciated that the relative sizes of the elements shown in FIG. 1 are not necessarily drawn to scale so that FIG. 1 can serve as a schematic lay-out view of the embodiments illustrated in the cross-sectional diagrams of FIGS. 2-5.

Referring to FIGS. 1 and 2, a semiconductor device may include a substrate 101, a device layer 110, first, second and third insulating interlayers 131, 132 and 133, first and second metal lines MLa and MLb, a conductive via Vb, air gaps AG, first and second dielectric layers 121 and 122, and a liner layer 141.

The first and second metal lines MLa and MLb may be extend in, for example, a first direction (the Y direction in FIGS. 1-2). The first metal lines MLa may be disposed at a first pitch P1 and the second metal lines MLb may be disposed at a second pitch P2. The second pitch P2 may be greater than the first pitch P1. The first metal lines MLa may each have a first width W1 and may be spaced apart from each other at a first interval S1 in a second direction (the X direction in FIGS. 1-2) that is perpendicular to the first direction. The second metal lines MLb may each have a second width W2 and may be spaced apart from each other at a second interval S2 in the second direction. The second width W2 may be greater than the first width W1. The second interval S2 may be greater than the first interval S1. In other embodiments, the second width W2 may be equal to the first width W1, and the second interval S2 may be greater than the first interval S1.

The first pitch P1 may be defined as a sum of the first width W1 and the first interval S1. The second pitch P2 may be defined as a sum of the second width W2 and the second interval S2. However, arrangements of the metal lines MLa and MLb and the conductive via Va and the pitches of the metal lines MLa and MLb are not limited to the arrangements shown in FIG. 1.

The substrate 101 may include semiconductor material, for example, a Group IV semiconductor material, a Group III-V compound semiconductor material or a Group II-VI compound semiconductor material. For example, the Group IV semiconductor material may include silicon, germanium or silicon-germanium. The substrate 101 may be, for example, a bulk wafer, an epitaxial layer or a silicon on insulator (SOI) substrate.

The device layer 110 may be disposed on the substrate 101 and may include semiconductor elements such as transistors, a lower wiring line and a lower insulating layer.

The first dielectric layer 121, the first insulating interlayer 131, the second dielectric layer 122 and the second insulating interlayer 132 may be sequentially stacked on the substrate 101 on which the device layer 110 is formed.

In some regions of the substrate 101, voids may be formed in the second insulating interlayer 132. The voids may comprise air gaps AG in some embodiments. It will be appreciated that the voids could be filled with a gas other than air in other embodiments. In the description that follows, the focus will be on voids that are implemented as air gaps. The air gaps AG may be disposed on at least one side of each of the first metal lines MLa. In some embodiments, respective air gaps AG may be disposed between adjacent first metal lines MLa, and the second insulating interlayer 132 may not be disposed between adjacent first metal lines MLa. In other embodiments, air gaps AG may be disposed on two opposed sides of at least one of the first metal lines MLa. Additional air gaps AG may respectively be disposed on at least one side of at least one of the second metal lines MLb. In some embodiments, at least one air gap AG and the second insulating interlayer 132 may be disposed together between two adjacent second metal lines MLb. In other embodiments, air gaps AG may be disposed on first and second opposed sides of at least one of the second metal lines MLb. The air gaps AG may continuously extend along the direction that the first and second metal lines MLa and MLb extend along. For example, the air gaps AG may continuously extend in the first direction (the Y direction) in parallel to the first and second metal lines MLa and MLb according to an embodiment.

The liner layer 141 may cover sidewalls of the first metal lines MLa and may extend to (or cover) top surfaces of the first metal lines MLa. Additionally, the liner layer 141 may cover sidewalls of at least one of the second metal lines MLb and a sidewall of the second insulating interlayer 132 and may extend to (or cover) top surfaces of the second metal lines MLb. The liner layer 141 may cover a top surface of the second insulating interlayer 132. The liner layer 141 may be continuously formed over an entire surface of the substrate 101 in some embodiments.

The third insulating interlayer 133 may be disposed on the liner layer 141 and may seal the air gaps AG in some embodiments. The air gaps AG may each be defined by the liner layer 141 and the third insulating interlayer 133 in some embodiments.

The second dielectric layer 122 may be disposed below the first metal lines MLa, the second metal lines MLb and the air gaps AG and may be an etch stop layer. The conductive via Vb may extend from one of the second metal lines MLb and may penetrate the second dielectric layer 122 and the first insulating interlayer 131 to be connected to the device layer 110. In some embodiments, the second metal lines MLb and the conductive via Vb may be integrally formed to form a dual damascene structure. In other embodiments, the second metal lines MLb and the conductive via Vb may be separately formed to form a single damascene structure.

Although the metal lines MLa and MLb are positioned at the same level above the substrate 101 in FIG. 2, the semiconductor devices according to example embodiments may also include multi-level wiring structures in which a plurality of metal lines similar to the metal lines MLa and MLb as shown in FIG. 2 are stacked in multiple levels above the substrate 101. In the multi-level wiring structure, the metal lines at different levels may have different widths, intervals, or/and pitches. For example, the metal lines positioned at a lower level may have a relatively small width, interval, and/or pitch compared to the metal lines positioned at an upper level.

The parasitic capacitance between adjacent ones of the metal lines MLa and MLb may occupy a large proportion of a total parasitic capacitance of a semiconductor device. Therefore, the air gaps can be provided between some adjacent metal lines to reduce the parasitic capacitance, and thus resistance-capacitance (RC) delay can be reduced and an operating speed of the semiconductor device can be increased.

Figure 3:
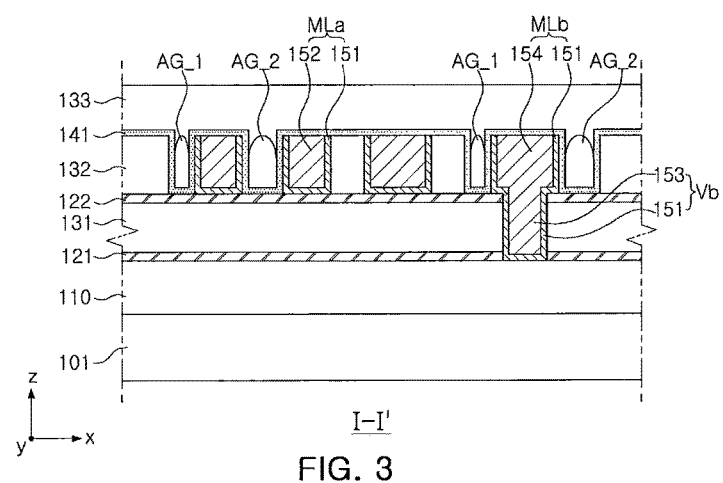
Figure 4:
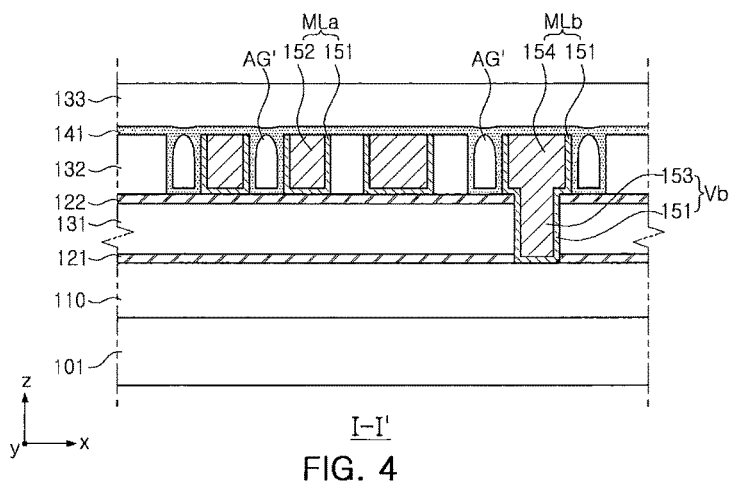
Figure 5:
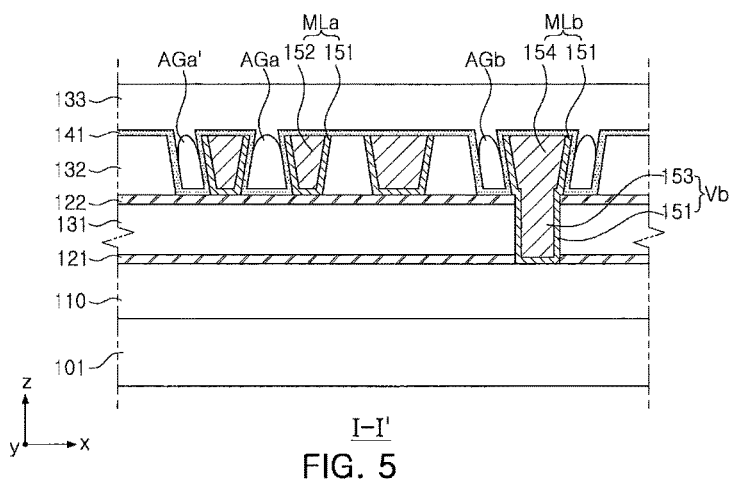

FIGS. 3 to 5 are cross-sectional views illustrating semiconductor devices according to additional example embodiments. The cross-sections of FIGS. 3-5 are also taken along line I-I' of FIG. 1. It will be appreciated that the widths in the X direction of the various metal lines, air gaps, insulating interlayers and the like in FIG. 1 are not drawn to scale, as the widths of various of these elements differ in the embodiments of FIGS. 2-5. Hereinafter, repeated descriptions of the same elements as described with reference to FIG. 2 will be omitted.

Referring to FIG. 3, unlike the embodiment illustrated in FIG. 2, first and second air gaps AG_1 and AG_2 that are formed on opposite sides of at least one of the first metal lines MLa and at least one of the second metal lines MLb may have different widths.

The width of the first air gap AG_1 on one side of at least one of the first metal lines MLa may be narrower than the width of the second air gap AG_2 on the other side of the at least one of the first metal lines MLa.

Likewise, the width of the second air gap AG_1 on one side of at least one of the second metal lines MLb may be narrower than the width of the second air gap AG_2 on the other side of the at least one of the second metal lines MLb.

Referring to FIG. 4, unlike the embodiment illustrated in FIG. 2, air gaps AG' may be sealed by the liner layer 141. In other words, in the embodiment of FIG. 4, the liner layer 141 may completely surround each air gap along the lengths of the respective air gaps.

To form such a structure, the liner layer 141 may be formed by a chemical vapor deposition process having a poor step coverage property. The liner layer 141 of the present embodiment may be thick compared to the liner layer 141 of FIG. 2.

Referring to FIG. 5, unlike the embodiment illustrated in FIG. 2, lower portions of the first and second metal lines MLa and MLb may be narrower than upper portions of the first and second metal lines MLa and Mlb. Thus, a shape of a third air gap AGa that is between two of the first metal lines MLa may be different from a shape of a fourth air gap AGa' that is between the second insulating interlayer 132 and any one of the first metal lines MLa. Additionally, the shape of the third air gap AGa that is between two of the first metal lines MLa may be different from a shape of a fifth air gap AGb that is between two of the second metal lines MLb.

FIGS. 6A to 6J are cross-sectional views illustrating a method of manufacturing a semiconductor device according to example embodiments.

Figure 6A:
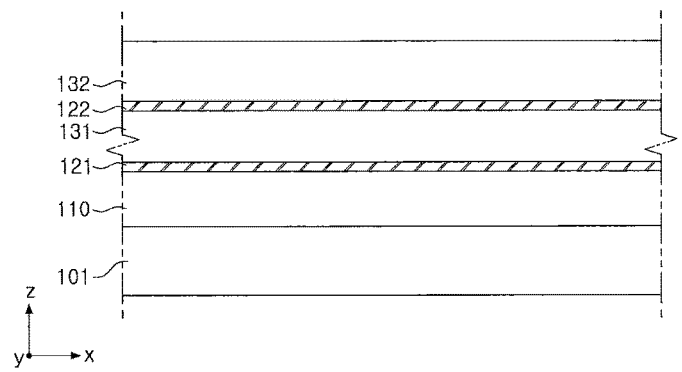
FIGS. 6A to 6J are views illustrating a method of manufacturing a semiconductor device according to example embodiments.

Referring to FIG. 6A, after forming a device layer 110 on a substrate 101, a first dielectric layer 121, a first insulating interlayer 131, a second dielectric layer 122 and a second insulating interlayer 132 may be sequentially stacked on the device layer 110.

The device layer 110 may include semiconductor elements, such as transistors, that may be formed by a front-end-of-line (FEOL) process and a lower insulating layer covering the semiconductor elements. Further, the device layer 110 may include a lower wiring layer that is connected to the semiconductor elements.

The first and second insulating interlayers 131 and 132 may be formed of, for example, silicon oxide or a low-k dielectric material that has a dielectric constant that is lower than the dielectric constant of silicon oxide.

The first and second dielectric layers 121 and 122 may be formed of, for example, silicon nitride (SiN), silicon carbonitride (SiCN), silicon oxycarbide (SiOC), silicon carbide (SiC), aluminium nitride (AlN), etc. The first and second dielectric layers 121 and 122 may be formed by, for example, a chemical vapour deposition (CVD) process or an atomic layer deposition (ALD) process.

Figure 6B:
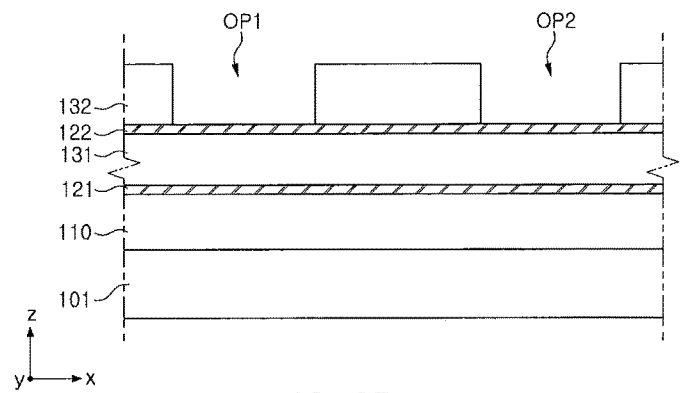

Referring to FIG. 6B, a first groove OP1 and a second groove OP2 may be formed in the second insulating interlayer 132 using photolithograpy and anisotropic etching processes. The first and second grooves OP1 and OP2 may expose a portion of the second dielectric layer 122. The first and second grooves OP1 and OP2 may extend in a first direction (the Y direction) that is perpendicular to a second direction (the X direction) and to a third direction (the Z direction).

The first and second grooves OP1 and OP2 may be formed in a region in which air gaps are to be formed. A width of each of the first and second grooves OP1 and OP2 may be determined based on a width of a metal line and a width of each air gap. For example, in the case in which the metal line is positioned in a central portion of the second groove OP2 and the air gaps are formed on opposite sides of the metal line, the width of the second groove OP2 may be determined as a sum of the width of the metal line and twice the width of each air gap. The width of the first and second grooves OP1 and OP2 may also take into account the thickness of any liner layer that defines the air gaps, at least in part, such as a liner layer 141 (refer to FIG. 6J).

Figure 6C:
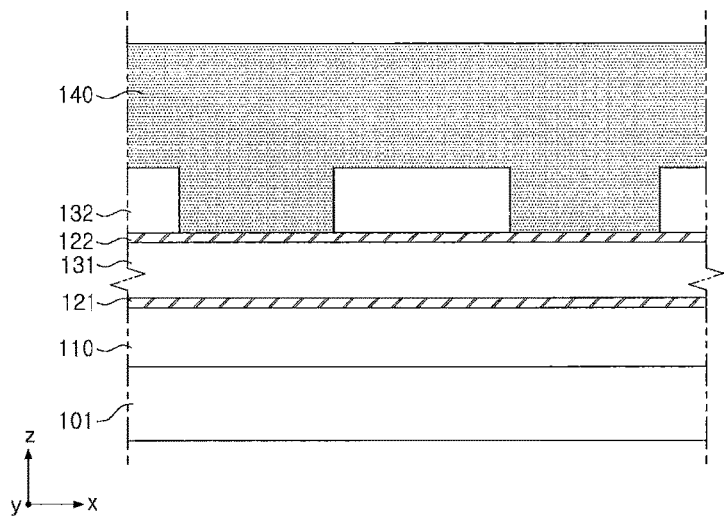

Referring to FIG. 6C, a sacrificial layer 140 may be formed to fill the first and second grooves OP1 and OP2. The sacrificial layer 140 may include, for example, a carbon-based spin on hardmask (SOH) layer, a silicon-based SOH layer or a combination thereof. In some embodiments, the sacrificial layer 140 may be formed of a flowable silicon oxide material. For example, the sacrificial layer 140 may be formed of a material capable of being decomposed by UV light, such as polyketoester, polyketoamide, etc. The sacrificial layer 140 may be formed by a CVD process, a physical vapour deposition (PVD) process or a spin coating process in some embodiments.

Figure 6D:
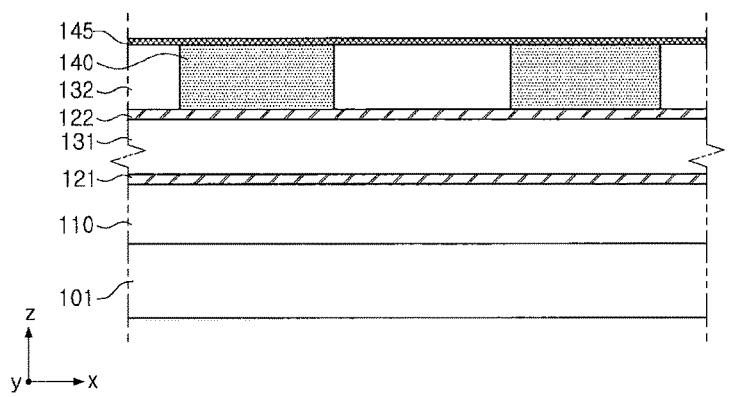

Referring to FIG. 6D, a chemical mechanical polishing (CMP) process or other planarizing process may be performed on the sacrificial layer 140 to remove an upper portion of the sacrificial layer 140 to expose the second insulating interlayer 132. Upon completion of the CMP process, a top surface of the sacrificial layer 140 may be substantially coplanar with a top surface of the second insulating interlayer 132. A metal mask layer 145 may be formed on the sacrificial layer 140 and the second insulating interlayer 132. The metal mask layer 145 may include, for example, titanium nitride (TiN).

Figure 6E:
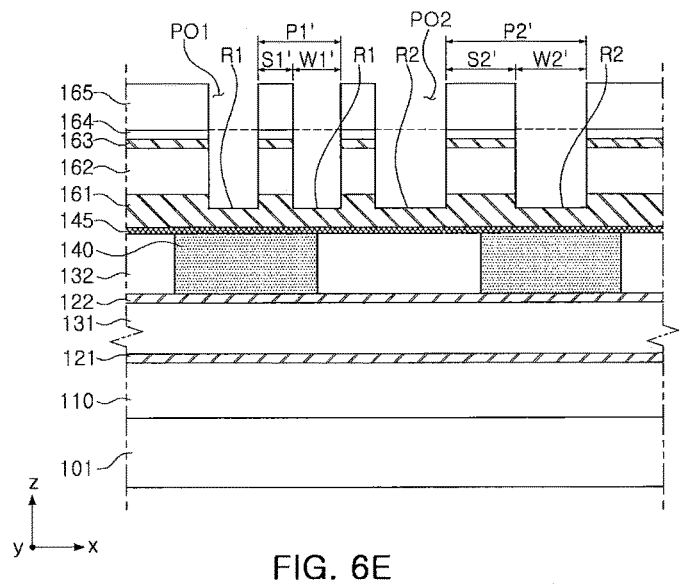

Referring to FIG. 6E, a first hard mask layer 161, a second hard mask layer 162, a third hard mask layer 163, a first reflection prevention layer 164 and a first photoresist layer 165 may be sequentially formed on the metal mask layer 145, and then the first photoresist layer 165 may be patterned. The first hard mask layer 161 and the third hard mask layer 163 may be formed of, for example, silicon oxynitride, and the second hard mask layer 162 may be formed of, for example, a SOH layer.

After patterning, the first photoresist layer 165 may include first opening patterns P01 that extend linearly in the Y direction and that are arranged at a first pitch P1' and may include second opening patterns P02 that extend linearly in the Y direction and that are arranged at a second pitch P2'. The first pitch P1' may be a sum of a width W1' of each of the first opening patterns P01 and a width S1' of an interval between adjacent first opening patterns P01. The second pitch P2' may be a sum of a width W2' of each of the second opening patterns P02 and a width S2' of an interval between adjacent second opening patterns P02.

The first reflection prevention layer 164, the third hard mask layer 163, the second hard mask layer 162 and the first hard mask layer 161 may be sequentially etched using an anisotropic etching process using the first photoresist layer 165 as an etch mask layer. As shown, the first hard mask layer 161 may partially be etched without entirely being etched.

After the anisotropic etching process is completed, the remaining portions of the first photoresist layer 165, the first reflection prevention layer 164, and the third and second hard mask layers 163, 162 that are on the first hard mask layer 161 may be removed such that the first hard mask layer 161 remains. The first hard mask layer 161 may include first recess patterns R1 that correspond to the first opening patterns P01 and may include second recess patterns R2 that correspond to the second opening patterns P02. In example embodiments, an interval between adjacent first recess patterns R1 may be smaller than an interval between adjacent second recess patterns R2. The first recess patterns R1 and the second recess patterns R2 may be formed to correspond to (or to be aligned with) a region in which metal lines are formed in a subsequent process.

Figure 6F:
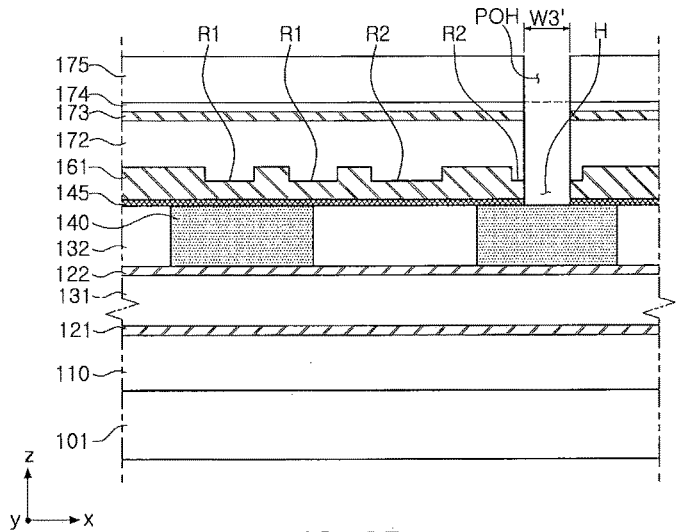

Referring to FIG. 6F, a fourth hard mask layer 172, a fifth hard mask layer 173, a second reflection prevention layer 174 and a second photoresist layer 175 may be formed on the first hard mask layer 161 to fill the first and second recess patterns R1 and R2 of the first hard mask layer 161, and then the second photoresist layer 175 may be patterned.

The fourth hard mask layer 172 may include a SOH layer, and the fifth hard mask layer 173 may include, for example, silicon oxynitride.

After patterning, the second photoresist layer 175 may include a third opening pattern POH that is above the second recess pattern R2 of the first hard mask layer 161. The third opening pattern POH may have a hole shape and a smaller width than a width of each of the second recess patterns R2.

The second reflection prevention layer 174, the fifth hard mask layer 173, the fourth hard mask layer 172, the first hard mask layer 161 and the metal mask layer 145 may be etched by an anisotropic etching process using the second photoresist layer 175 having the third opening pattern POH as an etch mask.

After the anisotropic etching process, the remaining portions of the second photoresist layer 175, the second reflection prevention layer 174 and the fifth and fourth hard mask layers 173, 172 that are on the first hard mask layer 161 may be removed, and the first hard mask layer 161 may remain. The first hard mask layer 161 may include a hole pattern H penetrating the first hard mask layer 161 under any one of the second recess patterns R2, as well as the first and second recess patterns R1 and R2. The hole pattern H may penetrate the metal mask layer 145 under the portion of the second recess pattern R2 to expose a portion of the sacrificial layer 140.

Figure 6G:
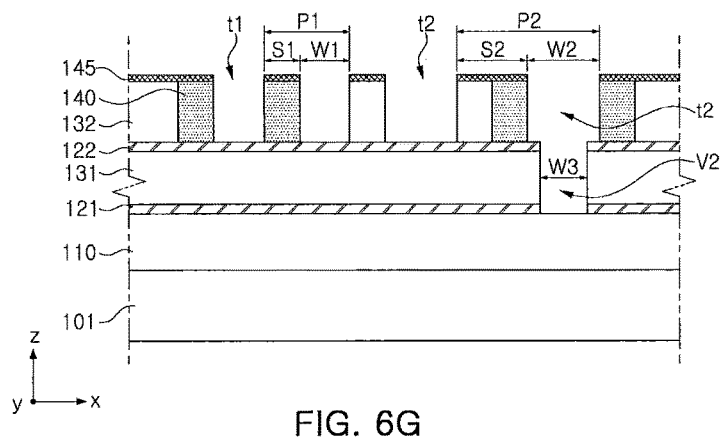

Referring to FIG. 6G, an etching process may be performed on the sacrificial layer 140 and the second insulating interlayer 132 using the first hard mask layer 161 including the first and second recess patterns R1 and R2 and the metal mask layer 145 including the hole pattern H, as an etch mask, thereby forming first trenches t1 and second trenches t2 that expose portions of the second dielectric layer 122. A via hole V2 that penetrates the second dielectric layer 122 and the first insulating interlayer 131 may further be formed under any one of the second trenches t2. The via hole V2 may expose a portion of the device layer 110. The first trenches t1, the second trenches t2 and the via hole V2 may be simultaneously formed by a single etching process. The first hard mask layer 161 may be removed after completion of the etching process. After forming the first and second trenches t1 and t2 and the via hole V2, the metal mask layer 145 may remain.

The first trenches t1 may each have a first width W1 and may be arranged at a first interval S1. The second trenches t2 may each have a second width W2 and may be arranged at a second interval S2. In some embodiments, the second width W2 may be greater than the first width W1, and the second interval S2 may be greater than the first interval S1. The via hole V2 may have a third width W3 that is smaller than the second width W2 of the second trenches t2.

Figure 6H:
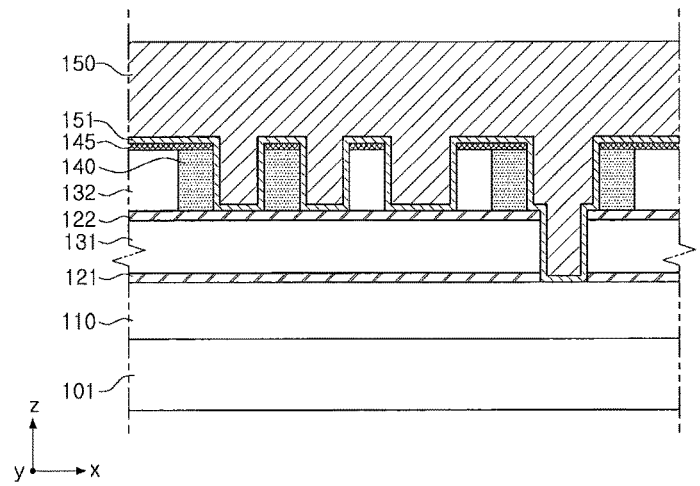

Referring to FIG. 6H, a diffusion barrier layer 151 and a metal layer 150 may be formed sequentially in the first and second trenches t1 and t2 and the via hole V2.

The diffusion barrier layer 151 may be formed by conformally depositing a material for the diffusion barrier layer 151 on inner surfaces of the first and second trenches t1 and t2 and the via hole V2. Next, the metal layer 150 may be formed on the diffusion barrier by an electroplating process. In some embodiments, a seed layer to form the metal layer 150 may be formed on the diffusion barrier layer 151 before the electroplating process is performed. The metal layer 150 may be formed to a thickness that is sufficient to completely fill the first and second trenches t1 and t2 and the via hole V2 according to an embodiment. The diffusion barrier layer 151 may include a metal and/or metal nitride. For example, the diffusion barrier layer 151 may include titanium (Ti), titanium nitride (TiN), tantalum (Ta), tantalum nitride (TaN), ruthenium (Ru), cobalt (Co), manganese (Mn) and/or tungsten nitride (WN). The metal layer 150 may include a metal such as copper (Cu), aluminium (Al), titanium (Ti) or tungsten (W).

Figure 6I:
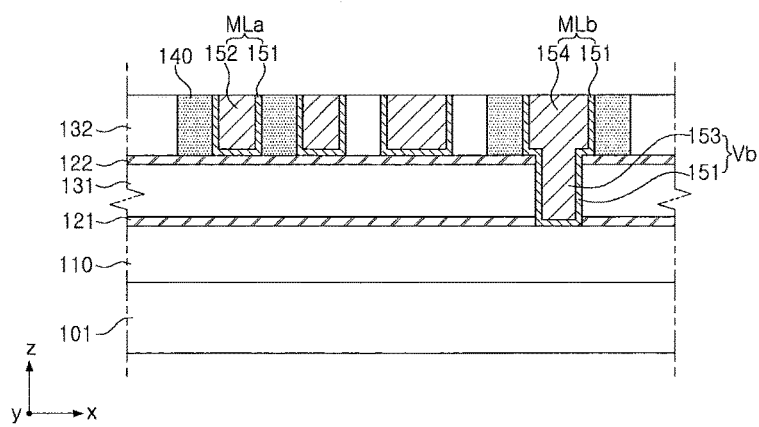

Referring to FIG. 6I, a planarization process such as a CMP process may be performed on the metal layer 150, the diffusion barrier layer 151 and the metal mask layer 145 to expose top surfaces of the second insulating interlayer 132 and the sacrificial layer 140. Thus, first metal lines MLa, each of which includes a first conductive layer 152 and the diffusion barrier layer 151, may respectively be formed in the first trenches t1, and second metal lines MLb, each of which includes a second conductive layer 154 and the diffusion barrier layer 151 may be respectively formed in the second trenches t2. Additionally, a conducive via (Vb) coupled to any one of the second metal lines MLb may be formed in the via hole V2.

In some embodiments, a capping layer formed of metal, metal oxide, metal nitride and/or metal oxynitride may be further formed on the first and second metal lines MLa and MLb. In some embodiments, the capping layer may be formed of at least one of tantalum, ruthenium, cobalt, manganese, titanium, tungsten, nickel, aluminium, oxide thereof, nitride thereof and oxynitride thereof. In other embodiments, the capping layer may be formed of at least one of Co, CoSi$_2$, CoWP and CoPRu. The capping layer may also be omitted.

Figure 6J:
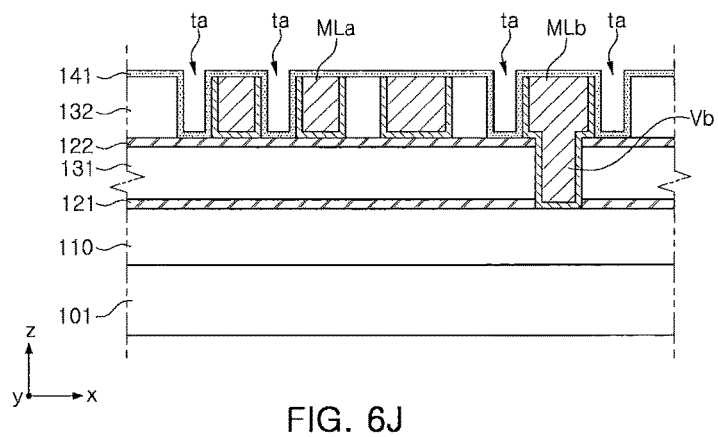

Referring to FIG. 6J, the remaining sacrificial layer 140 may be selectively removed to form air gap trenches ta.

The air gap trenches ta may expose at least one sidewall of each of the first metal lines MLa, at least one sidewall of at least one of the second metal lines MLa and a sidewall of the second insulating interlayer 132. A top surface of the second dielectric layer 122 may be exposed by the air gap trenches ta.

A liner layer 141 may be formed to cover inner surfaces of the air gap trenches ta and extend to top surfaces of the first and second metal lines MLa and MLb. For example, the liner layer 141 may cover sidewalls of the first metal lines MLa and may extend to (or cover) the top surfaces of the first metal lines MLa, and may also cover sidewalls of at least one of the second metal lines MLb and a sidewall of the second insulating interlayer 132 and may extend to (or cover) the top surfaces of the second metal lines MLb.

The liner layer 141 may protect the first and second metal lines MLa and MLb from moisture and/or oxygen and improve electromigration properties of the first and second metal lines MLa and MLb.

The liner layer 141 may be formed of silicon nitride (SiN), silicon carbonitride (SiCN), silicon carbide (SiC), silicon oxycarbide (SiOC) aluminium nitride (AlN), etc. The liner layer 141 may be formed by, for example, a CVD process or ALD process.

Next, referring again to FIG. 2, a third insulating interlayer 133 may be formed on the liner layer 141 to seal upper portions of the air gap trenches ta. Thus, air gaps AG may be formed on either one side or opposite sides of each of at least some of the first and second metal lines MLa and MLb. The air gaps AG may have a tunnel shape continuously extending along an extension direction of the first and the second metal lines MLa and MLb. For example, the air gaps AG may continuously extend in the Y direction parallel to the extension direction of the first and the second metal lines MLa and MLb.

The third insulating interlayer 133 may be formed by a deposition process having a poor step coverage property.

By the above described processes, the air gaps AG having the same width can be formed between the metal lines having different intervals (or different pitch) and/or on sides of the metal lines.

Figure 7:
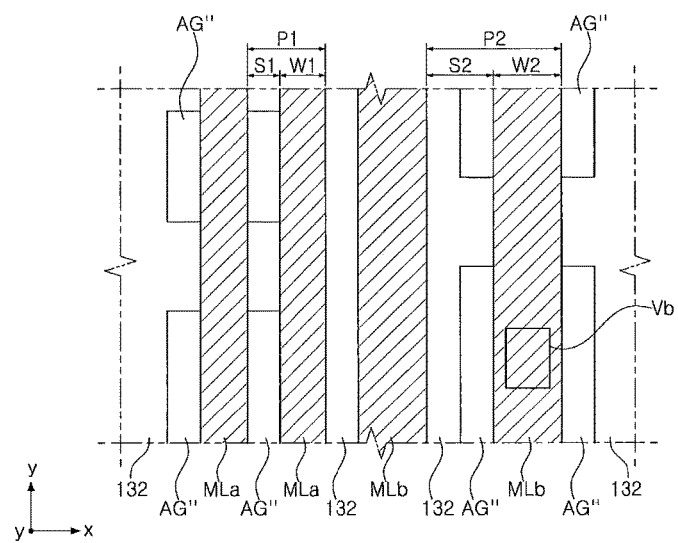
FIG. 7 is a lay-out illustrating a semiconductor device according to example embodiments.

FIG. 7 is a lay-out illustrating a semiconductor device according to example embodiments. Hereinafter, repeated descriptions of the same elements as described with reference to FIG. 1 will be omitted.

Referring to FIG. 7, unlike the example embodiments of FIG. 1, air gaps AG" may be cut off at a certain region without continuously extending in an extension direction of first and second metal lines MLa and MLb. In other words, the air gaps AG" may discontinuously extend in a direction (e.g., a Y direction) parallel to an extension direction of first and second metal lines MLa and MLb. As an example, the air gaps AG" may not be formed on sides of a portion of any one of the first metal lines MLa, corresponding to a region in which a conductive via is formed so as to connect the first metal lines MLa to an upper metal line on the first metal lines MLa.

According to example embodiments of the inventive concepts, the semiconductor device may include at least one air gap formed in the insulating interlayer without damage to the metal lines and/or over-etching of the insulating interlayer, and thus the electrical properties of the semiconductor device may be improved.

Figure 8:
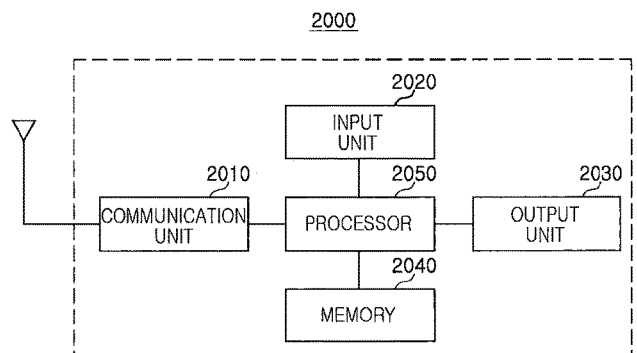
FIG. 8 is a block-diagram illustrating an electronic device according to example embodiments.

FIG. 8 is a block-diagram illustrating an electronic device according to example embodiments.

Referring to FIG. 8, an electronic device 2000 may include a communication unit 2010, an input unit 2020, an output unit 2030, a memory 2040 and a processor 2050.

The communication unit 2010 may include a wired/wireless communication module. The communication unit 2010 may include a wireless internet module, a short-range communication module, a global positioning system (GPS) module, a mobile communication module. The wired/wireless communication module of the communication unit 2010 may be connected to an external communication network by various communication standards, thereby transmitting and receiving data.

The input unit 2020, provided to allow a user to control an operation of the electronic device 2000, may include a mechanical switch, a touch screen, a voice recognition module, etc. The input unit 2020 may include a mouse operating in a track ball or a laser pointer manner, or a finger mouse. In addition, the input unit 2020 may include a variety of sensor module allowing the user to input data.

The output unit 2030 may output information processed in the electronic device 2000 in an audio or video format. The memory 2040 may store a program for controlling and processing of the processor 2050, data, or the like. The processor 2050 may deliver a command to the memory 2040 according to an operation to store data to the memory 2040 or retrieve data therefrom.

The memory 2040 may be installed in the electronic device 2000 or may communicate with the processor 2050 through a separate interface. In the case where the memory 2040 communicates with the processor 2050 through the separate interface, the processor 2050 may store data to the memory 2040 or retrieve therefrom through various interface standards such as SD, SDHC, SDXC, MICRO SD, USB or the like.

The processor 2050 may control operations of respective components of the electronic device 2000. The processor 2050 may perform controlling and processing related to an audio call, a video call, data communications, and the like, or may perform controlling and processing for multimedia playback and management. Also, the processor 2050 may process an input delivered from the user through the input unit 2020 and may output corresponding results through the output unit 2030. Further, as described above, the processor 2050 may store data required for controlling the operation of the electronic device 2000 to the memory 2040 or retrieve the data therefrom. At least one of the memory 2040 and the processor 2050 may include the semiconductor device according to example embodiments as described above.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a first insulating interlayer on top of a substrate;
   metal lines in the first insulating interlayer, the metal lines including a plurality of first metal lines in a first region of the first insulating interlayer and a plurality of second metal lines in a second region of the first insulating interlayer;
   a first air gap between first and second ones of the first metal lines and a second air gap between the first insulating interlayer and a first one of the second metal lines;
   a liner layer covering top surfaces and side walls of the metal lines and a top surface and a side wall of a portion of the first insulating interlayer that is adjacent the second air gap; and
   a second insulating interlayer that directly contacts the liner layer.

2. The semiconductor device of claim 1, wherein the metal lines extend in a first direction and are spaced apart from each other in a second direction that is perpendicular to the first direction, and wherein along a cross-section of the semiconductor device taken along the second direction the first and second air gaps are completely surrounded by the liner layer and the second insulating interlayer.

3. The semiconductor device of claim 1, wherein the metal lines extend in a first direction and are spaced apart from each other in a second direction that is perpendicular to the first direction, and wherein along a cross-section of the semiconductor device taken along the second direction the first and second air gaps are completely surrounded by the liner layer.

4. The semiconductor device of claim 1, wherein adjacent ones of the first metal lines are spaced apart from each other by a first interval and adjacent ones of the second metal lines are spaced apart from each other by a second interval that is greater than the first interval.

5. The semiconductor device of claim 1, further comprising an etch stop layer under the metal lines, the first insulating interlayer and the first and second air gaps.

6. The semiconductor device of claim 5, further comprising a conductive via under a first one of the metal lines, the conductive via penetrating the etch stop layer and coupled to the first one of the metal lines.

7. The semiconductor device of claim 1, further comprising a third air gap on a sidewall of the first one of the first metal lines,
wherein the first and third air gaps have different widths.

8. The semiconductor device of claim 1, wherein the first air gap has a shape different from a shape of the second air gap.

9. The semiconductor device of claim 1, wherein the metal lines extend in a first direction and are spaced apart from each other in a second direction that is perpendicular to the first direction, and wherein the first and second air gaps continuously extend in the first direction.

10. The semiconductor device of claim 1, wherein the metal lines extend in a first direction and are spaced apart from each other in a second direction that is perpendicular to the first direction, and wherein the first and second air gaps discontinuously extend in the first direction.

11. A semiconductor device, comprising:
a first insulating interlayer on a substrate;
first metal lines arranged at a first interval in the first insulating interlayer and second metal lines arranged at a second interval that is larger than the first interval in the first insulating interlayer; and
air gaps on at least one side of each of the first metal lines and on at least one side of a first one of the second metal lines;
wherein some of the air gaps are disposed between respective pairs of adjacent ones of the first metal lines, and the first insulating interlayer is not disposed between the pairs of adjacent ones of the first metal lines, and at least one of the air gaps and the first insulating interlayer are disposed between a pair of adjacent ones of the second metal lines.

12. The semiconductor device of claim 11, further comprising a liner layer covering sidewalls of the first metal lines and a sidewall of the first insulating interlayer and sidewalls of the first one of the second metal lines and top surfaces of the first and second metal lines.

13. The semiconductor device of claim 12, further comprising a second insulating interlayer on the liner layer and above the air gaps.

14. The semiconductor device of claim 12, wherein the first and second metal lines extend in a first direction and are spaced apart from each other in a second direction that is perpendicular to the first direction, and wherein along a cross-section of the semiconductor device taken along the second direction the air gaps are completely surrounded by the liner layer.

15. The semiconductor device of claim 11, wherein the air gaps include a first air gap and a second air gap on respective first and second opposed sides of at least one of the first or second metal lines, and
wherein a width of the first air gap is different from a width of the second air gap.

16. The semiconductor device of claim 11, wherein the first and second metal lines each have an upper portion and a lower portion that is narrower than the upper portion, and
wherein the air gaps include a first air gap between the first metal lines and a second air gap either between the first insulating interlayer and one of the first metal lines or between two of the second metal lines, and a shape of the first air gap is different from a shape of the second air gap.

17. The semiconductor device of claim 11, wherein the first and second metal lines extend in a first direction and are spaced apart from each other in a second direction that is perpendicular to the first direction, and wherein the air gaps continuously extend in the first direction.

18. The semiconductor device of claim 11, wherein the first and second metal lines extend in a first direction and are spaced apart from each other in a second direction that is perpendicular to the first direction, and wherein the air gaps discontinuously extend in the first direction.

19. The semiconductor device of claim 11, further comprising an etch stop layer under the first insulating interlayer, the first and second metal lines and the air gaps.

20. The semiconductor device of claim 19, further comprising a conductive via extending from the first one of the second metal lines and penetrating the etch stop layer.

* * * * *